United States Patent
Ren et al.

(10) Patent No.: US 10,529,128 B1
(45) Date of Patent: Jan. 7, 2020

(54) APPARATUS, SYSTEM, AND METHOD FOR MAPPING A 3D ENVIRONMENT

(71) Applicant: Oculus VR, LLC, Menlo Park, CA (US)

(72) Inventors: Yuheng Ren, Newcastle, WA (US); Julian Straub, Redmond, WA (US); Shobhit Verma, Sammamish, WA (US); Richard Andrew Newcombe, Seattle, WA (US); Renzo De Nardi, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 6 days.

(21) Appl. No.: 15/964,831

(22) Filed: Apr. 27, 2018

(51) Int. Cl.
*G06T 17/05* (2011.01)
*G06T 7/521* (2017.01)
*G06T 7/593* (2017.01)
*B25J 5/00* (2006.01)
*A45F 3/10* (2006.01)
*H03G 3/32* (2006.01)

(52) U.S. Cl.
CPC .............. *G06T 17/05* (2013.01); *A45F 3/10* (2013.01); *B25J 5/007* (2013.01); *G06T 7/521* (2017.01); *G06T 7/593* (2017.01); *H03G 3/32* (2013.01); *A45F 2200/0533* (2013.01)

(58) Field of Classification Search
None
See application file for complete search history.

(56) References Cited

U.S. PATENT DOCUMENTS

| | | | | |
|---|---|---|---|---|
| 9,602,811 | B2 * | 3/2017 | Hillebrand | H04N 13/243 |
| 9,693,040 | B2 * | 6/2017 | Hillebrand | H04N 13/243 |
| 9,858,672 | B2 * | 1/2018 | Trail | G06T 7/521 |
| 9,976,849 | B2 * | 5/2018 | Trail | G06T 7/521 |
| 10,158,845 | B2 * | 12/2018 | Zhu | G01B 11/2513 |
| 10,186,301 | B1 * | 1/2019 | van Hoff | G11B 27/34 |
| 2010/0220176 | A1 * | 9/2010 | Ziemeck | A61N 1/36046 348/50 |
| 2013/0114861 | A1 * | 5/2013 | Takizawa | G06T 7/74 382/106 |
| 2013/0153651 | A1 * | 6/2013 | Fedorovskaya | G06K 9/2036 235/375 |
| 2013/0250036 | A1 * | 9/2013 | Rosenberg | H04N 7/152 348/14.09 |
| 2014/0028553 | A1 * | 1/2014 | Harland | G06F 3/0304 345/158 |
| 2014/0176954 | A1 * | 6/2014 | Scott | F41H 3/00 356/445 |
| 2015/0071524 | A1 * | 3/2015 | Lee | G06K 9/00208 382/154 |

(Continued)

*Primary Examiner* — Reza Aghevli
(74) *Attorney, Agent, or Firm* — FisherBroyles, LLP (57) ABSTRACT

A sensor apparatus may include an array of protruding members that each extend outward in a different radial direction from a central axis, each protruding member including a projector that projects structured light into a local environment, one or more cameras that capture reflections of the structured light from the local environment, and another camera that captures visible-spectrum light from the local environment. The sensor apparatus may also include one or more localization devices for determining a location of the sensor apparatus. Various other apparatuses, systems, and methods are also disclosed.

20 Claims, 10 Drawing Sheets

(56) References Cited

U.S. PATENT DOCUMENTS

| | | | |
|---|---|---|---|
| 2015/0077517 A1* | 3/2015 | Powers | H04N 5/2253 348/46 |
| 2015/0178412 A1* | 6/2015 | Grau | G06F 17/50 703/1 |
| 2016/0191815 A1* | 6/2016 | Annau | H04N 13/111 348/38 |
| 2016/0223828 A1* | 8/2016 | Abraham | G01C 3/02 |
| 2017/0163962 A1* | 6/2017 | Zhang | G01B 11/2513 |
| 2017/0163969 A1* | 6/2017 | Cronie | G01B 11/2513 |
| 2017/0195654 A1* | 7/2017 | Powers | G06T 7/521 |
| 2018/0165833 A1* | 6/2018 | Inoue | G06T 3/00 |
| 2018/0204329 A1* | 7/2018 | Cutu | G06T 5/001 |
| 2018/0211373 A1* | 7/2018 | Stoppa | G06T 7/55 |
| 2018/0232571 A1* | 8/2018 | Bathiche | G06K 9/00369 |
| 2019/0098276 A1* | 3/2019 | Duggan | H04N 13/296 |

\* cited by examiner

Environment-Mapping System
500

APPARATUS, SYSTEM, AND METHOD FOR MAPPING A 3D ENVIRONMENT

BACKGROUND

Digital mapping is increasingly used for a variety of applications. For instance, digital mapping can be used to create or recreate an environment for augmented or virtual reality. In these instances, a 3-dimensional (3D) space may be captured and then digitally rendered using a computing system to recreate the virtual space. Some mapping systems may utilize a digital camera to capture image data of from the space by sweeping in a rotational manner. Additionally or alternatively, technology such as light detection and ranging (LIDAR) methods can utilize lasers to detect the topography of the 3D space.

However, traditional methods may have some drawbacks that cause them to be slow or inadequate for detailed mapping of various 3D environments. For example, a sweeping camera typically needs to be set in one place for a certain amount of time to capture image data during a full rotation. Furthermore, regions that are obstructed by objects may not be entirely captured or may be incorrectly mapped. To capture these obstructed regions or additional positions within an environment, the camera may need to be moved to a new location and set to capture image data during another rotation. For a complex environment, this method may be tedious and slow, as a user needs to constantly adjust the camera. LIDAR technology may improve upon the speed of capture, but it may not provide highly detailed information about object colors and textures. Therefore, better methods of capturing data from 3D environments are needed in order to improve the speed and quality of mapping 3D representations.

SUMMARY

As will be described in greater detail below, the instant disclosure describes various apparatuses, systems, and methods for mapping a 3D environment by utilizing a globe-like sensor apparatus, which includes a variety of cameras and sensors, that is mounted to a chassis that enables mobility. In one example, a sensor apparatus may include an array of protruding members that each extend outward in a different radial direction from a central axis. In this example, each protruding member may include a projector that projects structured light into a local environment, one or more cameras that capture reflections of the structured light from the local environment, and another camera that captures visible-spectrum light from the local environment. The sensor apparatus may also include one or more localization devices for determining a location of the sensor apparatus. In further examples, the sensor apparatus may include one or more microphones that capture ambient sound from the local environment.

In some embodiments, the projector may be mounted to a middle section of the protruding member such that the structured light is projected away from the central axis. In additional embodiments, the structured light may include a pattern of light points. In these embodiments, a camera may capture a distortion of the pattern of light points to detect a distance between the camera and each light point.

In some examples, the localization device may include one or more localization cameras that capture image data for determining a relative position of the sensor apparatus within the local environment. Additionally or alternatively, the localization device may include one or more localization sensors that determine a geographic location of the sensor apparatus.

According to various embodiments, a corresponding environment-mapping system may include a sensor apparatus that includes a plurality of projectors that project structured light into a local environment, a plurality of cameras that capture reflections of the structured light from the local environment, a plurality of other cameras that capture visible-spectrum light from the local environment, and one or more localization devices for determining a location of the sensor apparatus. The environment-mapping system may also include a chassis that supports the sensor apparatus such that the sensor apparatus is movable within the local environment. Additionally, the environment-mapping system may include a computing subsystem communicatively coupled to the sensor apparatus and mounted to the chassis, wherein the computing subsystem may transmit control signals to the sensor apparatus for controlling the projectors, the cameras that capture reflections of the structured light, the other cameras that capture visible-spectrum light, and/or a localization device.

In one example, the localization device may include one or more localization cameras that capture image data for determining a relative position of the sensor apparatus within the local environment and/or one or more localization sensors that determine a geographic location of the sensor apparatus. In this example, a localization sensor may include one or more sensors mounted at a central axis of the sensor apparatus and/or one or more wireless sensors of the computing subsystem electronically coupled to the sensor apparatus.

In one embodiment, the sensor apparatus may also include one or more microphones that capture ambient sound from the local environment. In this embodiment, the computing subsystem may transmit control signals to the sensor apparatus for controlling a microphone.

In some examples, the chassis may include a wearable frame that adjustably elevates the sensor apparatus above a user's head. In these examples, the wearable frame may include a backpack frame dimensioned to adjustably fit to the user's shoulders and waist and a mounting pole coupled to the backpack frame that mounts the sensor apparatus above the user's head at an adjustable height and an adjustable tilt. Additionally or alternatively, the chassis may include a mobile cart dimensioned to move the sensor apparatus within the local environment. In these examples, the mobile cart may include a set of wheels, a platform coupled to the set of wheels and dimensioned to hold the sensor apparatus and the computing subsystem, a handle protruding from the platform and dimensioned to facilitate moving the mobile cart, and/or a mounting pole coupled to the platform that mounts the sensor apparatus at an adjustable height and an adjustable tilt.

In some embodiments, the computing subsystem may be communicatively coupled to the sensor apparatus by a wired connection. Additionally or alternatively, the computing subsystem may be communicatively coupled to the sensor apparatus by a wireless connection.

In one example, the computing subsystem may receive depth data from the sensor apparatus by transmitting a control signal to one or more projectors of the plurality of projectors directing a projector to project structured light into the local environment. Additionally, the computing subsystem may then collect light reflection data from one or more cameras of the plurality of cameras that capture reflections of the structured light.

In one embodiment, the computing subsystem may collect and store data about the local environment from the sensor apparatus during an environment-mapping session. In this embodiment, the computing subsystem may transmit the data about the local environment from the sensor apparatus to a server that reconstructs a digital map of the local environment based on the transmitted data.

In addition to the various systems and apparatuses described herein, the instant disclosure presents exemplary methods for mapping a 3D environment. For example, a corresponding method may include projecting, from a plurality of projectors of a sensor apparatus, structured light into a local environment, wherein the sensor apparatus may include an array of protruding members that each extend outward in a different radial direction from a central axis. In this example, each protruding member may include a projector of the plurality of projectors. The method may also include capturing, by a plurality of cameras of the sensor apparatus, reflections of the structured light from the local environment, wherein each protruding member of the array of protruding members includes one or more cameras of the plurality of cameras that capture reflections of the structured light. Additionally, the method may include capturing, by a plurality of other cameras of the sensor apparatus, visible-spectrum light from the local environment, wherein each protruding member of the array of protruding members includes a camera of the plurality of other cameras that capture visible-spectrum light. Furthermore, the method may include determining, by one or more localization devices of the sensor apparatus, a location of the sensor apparatus.

In some embodiments, the above method may further include capturing, by one or more microphones, ambient sound from the local environment.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes and illustrates various apparatuses, systems, and methods for mapping a 3D environment. As will be explained in greater detail below, embodiments of the instant disclosure may, using a combination of different cameras and sensors, capture detailed information about an enclosed environment. For example, a globe-shaped apparatus may use a combination of projectors, cameras that capture reflections of structured light, and other cameras that capture visible-spectrum light to capture information about the appearance and locations of objects and features within the environment. Additionally, location cameras and sensors may pinpoint a location of the apparatus within the environment while the apparatus captures the information. Microphones may be strategically placed in various positions on the apparatus to help capture ambient sounds to enhance a virtual experience. Furthermore, the rounded shape of the apparatus, combined with a portable form factor such as a backpack frame or a cart, may facilitate capturing the environment while a user moves through the environment.

The following will provide, with reference to FIGS. 1-4, detailed descriptions of a sensor apparatus that captures an enclosed 3D environment. In addition, the discussion associated with FIGS. 5-8 will provide examples of environment-mapping systems that incorporate the sensor apparatus to capture the enclosed environment during a mapping session. The discussion associated with FIG. 9 will provide an example of a computing subsystem capturing data to create a digital map of the environment. Furthermore, detailed descriptions of methods for mapping a 3D environment will be provided in connection with FIG. 10.

Figure 1:
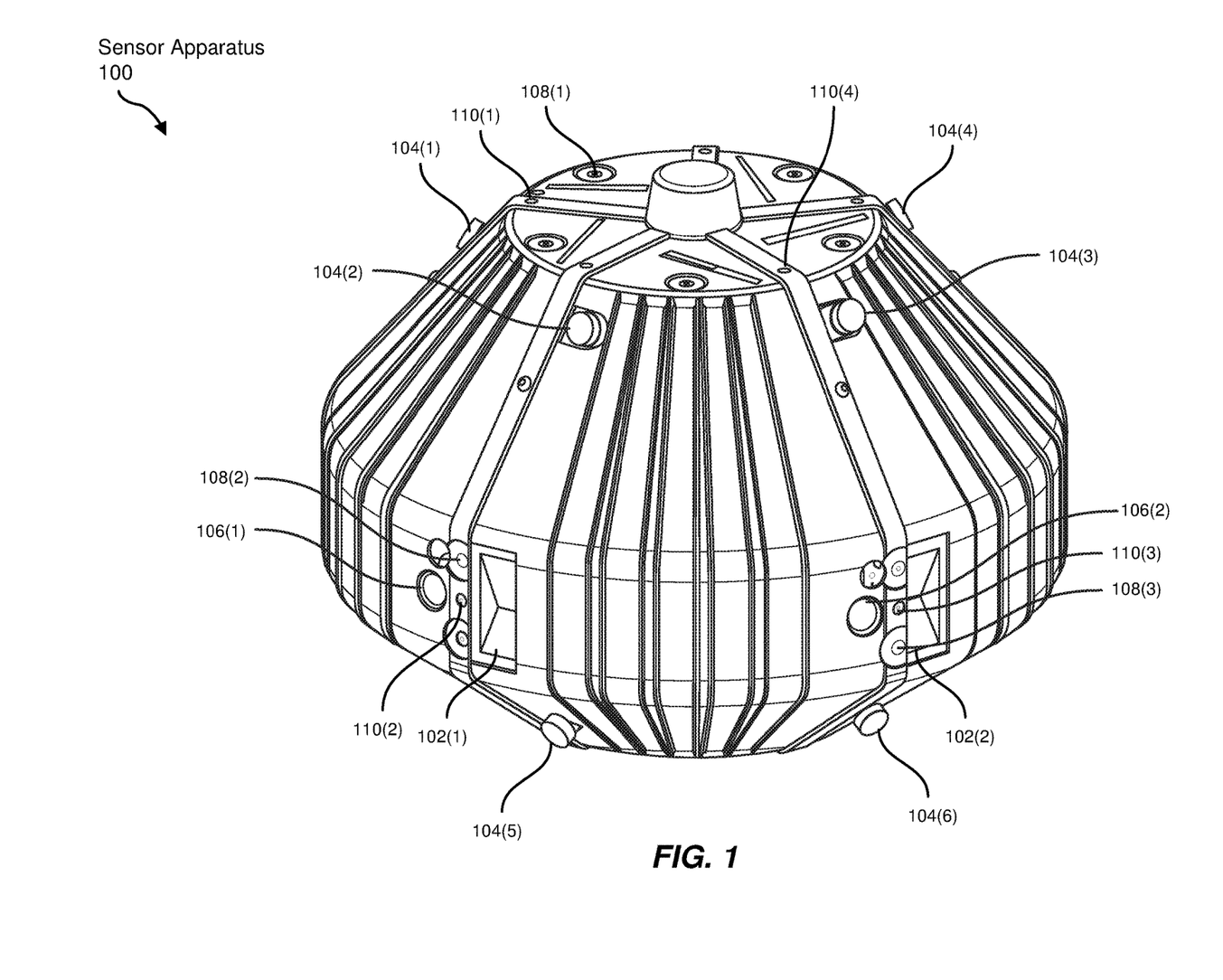
FIG. 1 is a perspective view of an exemplary sensor apparatus according to some embodiments.

FIG. 1 illustrates a perspective view of an exemplary sensor apparatus 100. Sensor apparatus 100 may include an array of protruding members that each include a projector, such as projectors 102(1) and 102(2) shown in FIG. 1. Projectors 102(1) and 102(2) may project structured light into a local environment. In some embodiments, the local environment may represent a closed environment, such as an indoor environment without strong infrared (IR) interference from sunlight, and/or any other suitable environment. Sensor apparatus 100 may also include cameras that correspond to the projectors, such as cameras 104(1), 104(2), 104(3), 104(4), 104(5), and 104(6) shown in FIG. 1. Cameras 104(1)-(6) may represent cameras, such as digital cameras, digital IR cameras, and/or any other suitable cameras, that capture reflections of the structured light to determine a distance between sensor apparatus 100 and objects within the local environment.

In some embodiments, sensor apparatus 100 may also include other cameras, such as cameras 106(1) and 106(2) shown in FIG. 1, that capture visible-spectrum light from a local environment. In these embodiments, cameras 106(1) and 106(2) may represent cameras, such as digital photographic cameras and/or any other suitable cameras, that capture color information from the local environment. The combination of cameras that capture visible-spectrum light and cameras that capture reflections of structured light may capture the colors and distances of objects from sensor apparatus 100 to reconstruct the locations and appearances of the objects within the local environment.

Additionally, sensor apparatus 100 may include one or more localization devices for determining a location of sensor apparatus 100. In some examples, localization devices may include one or more localization cameras, such as localization cameras 108(1), 108(2), and 108(3) shown in FIG. 1, that capture image data for determining a relative position of sensor apparatus 100 within the local environment. For example, localization cameras 108(1)-(3) may be strategically mounted around sensor apparatus 100 to capture broad information about the location of sensor apparatus 100 within the local environment.

Furthermore, in some examples, sensor apparatus 100 may include one or more microphones, such as microphones 110(1), 110(2), 110(3), and 110(4), that capture ambient sound from the local environment. In these examples, microphones 110(1)-(4) may also be strategically mounted around sensor apparatus 100 to more fully capture audio data and ambient sounds that may be used to recreate audio for a virtual environment. The above projectors, cameras, and other devices may be jointly used in a simultaneous localization and mapping (SLAM) system to identify and/or map features of the local environment and/or to identify a location, orientation, and/or movement of sensor apparatus 100 and/or other objects in the local environment.

Figure 2:
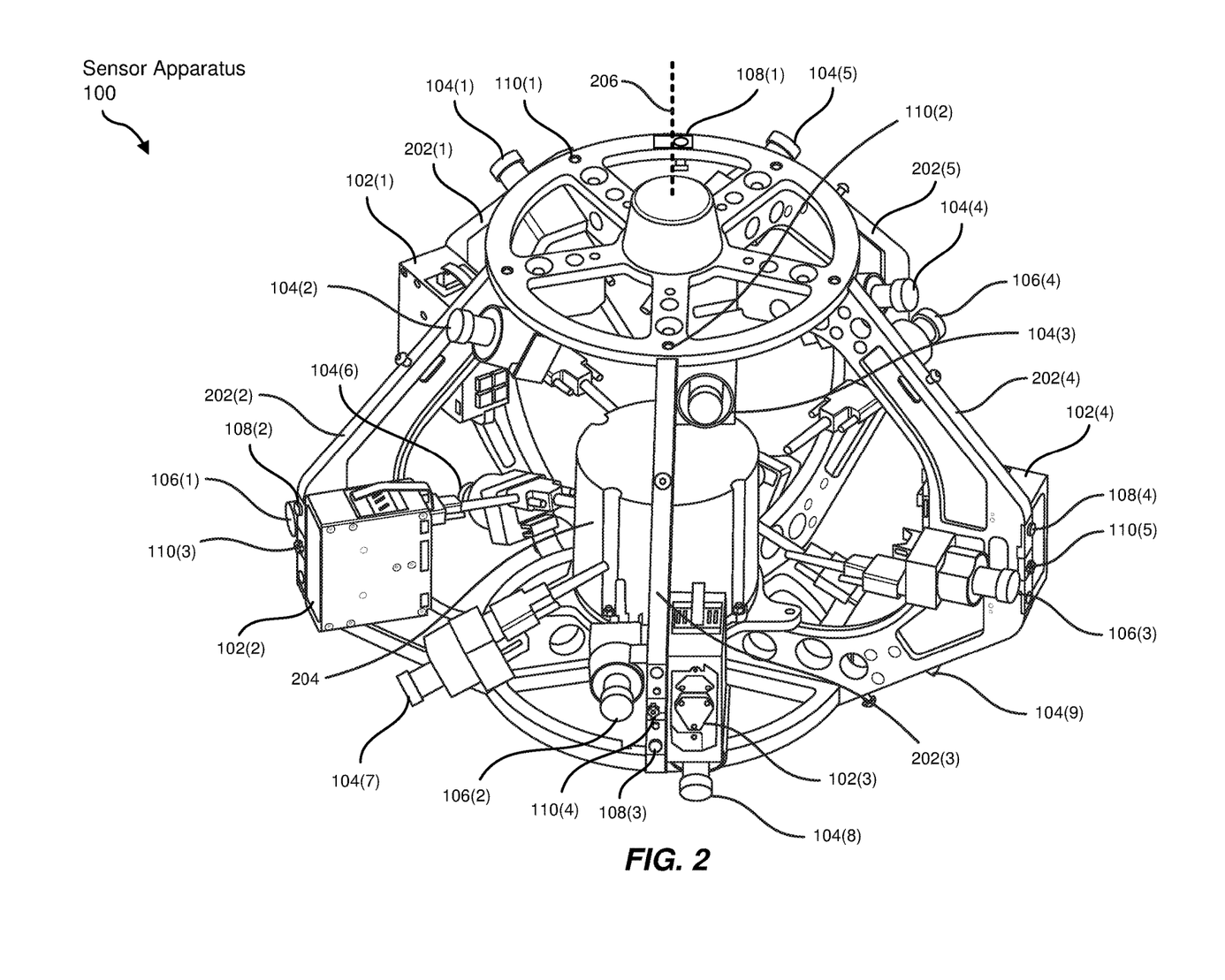
FIG. 2 is an interior view of a sensor apparatus according to some embodiments.

FIG. 2 illustrates an interior view of sensor apparatus 100. As shown in FIG. 2, an array of protruding members 202(1), 202(2), 202(3), 202(4), and 202(5) may each extend outward in a different radial direction from a central axis 206. Similar to FIG. 1, each protruding member may include a projector, such as projectors 102(1)-(4), one or more cameras that capture reflections of structured light, such as cameras 104(1)-(9), and another camera, such as one of cameras 106(1)-(4). In this example, sensor apparatus 100 may also include one or more localization cameras, such as localization cameras 108(1)-(4), on each of protruding members 202(1)-(5) and/or at other strategic positions around sensor apparatus 100. Additionally, in some examples, sensor apparatus 100 may include one or more microphones, such as microphones 110(1)-(5) disposed at various locations.

In some embodiments, a localization device of sensor apparatus 100 may include, for example, a localization sensor 204 that determines a geographic location of sensor apparatus 100. In these embodiments, localization sensor 204 may include a sensor mounted at central axis 206 and/or any other suitable portion of sensor apparatus 100. For example, localization sensor 204 may represent a fiber optic gyroscope (FOG) and/or an inertial measurement unit (IMU) that detects an orientation and/or a movement of sensor apparatus 100. Additionally or alternatively, localization sensor 204 may represent a Global Positioning System (GPS) antenna and/or any other suitable sensor for detecting location and orientation. Localization sensor 204 may combine with localization cameras 108(1)-(4) to determine the location and/or movement of one or more objects within the local environment. For example, as sensor apparatus 100 moves through the local environment, localization cameras 108(1)-(4) may determine the relative location of sensor apparatus 100 to objects within the local environment and compare the location with absolute location data from localization sensor 204 to detect a discrepancy that indicates a change in position and/or movement of an object.

Figure 3:
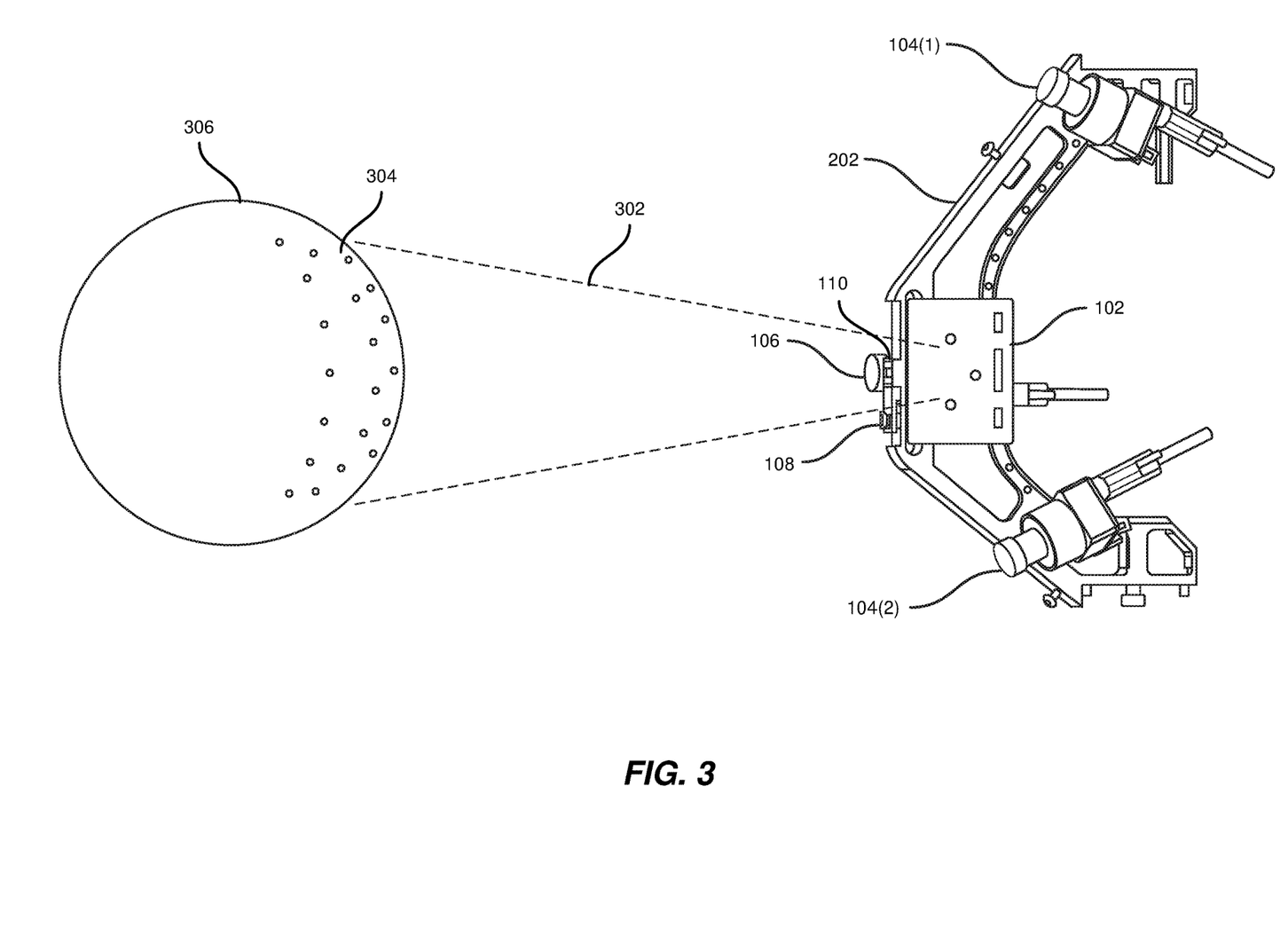
FIG. 3 is a side view of structured light projected from a projector onto an example object according to some embodiments.

FIG. 3 illustrates structured light 302 projected by a projector 102 onto an exemplary object 306. In the example of FIG. 3, a single protruding member 202 of a sensor apparatus (e.g., sensor apparatus 100 of FIGS. 1 and 2) may include projector 102 that projects structured light into a local environment, including structured light 302 that is projected onto object 306, cameras 104(1) and 104(2) that capture reflections of structured light from the local environment, including reflections of structured light 302 from object 306, and another camera 106 that captures visible-spectrum light from the local environment including object 306. In this example, protruding member 202 may also include localization camera 108 and microphone 110.

In some embodiments, projector 102 may be mounted to a middle section of protruding member 202 as illustrated in FIG. 3 and/or to any other suitable portion of protruding member 202 such that structured light 302 is projected away from the central axis of the sensor apparatus (e.g., central axis 206 of sensor apparatus 100 shown in FIG. 2). In these embodiments, structured light 302 may include a pattern 304 of light points. Projector 102 may project multiple light points of pattern 304 onto object 306 as shown in FIG. 3. Cameras 104(1) and 104(2) may then capture at least a portion of light from pattern 304 reflected by object 306 to determine the distance between each light point and cameras 104(1) and 104(2), thus determining the distance between object 306 and sensor apparatus 100.

Figure 4A:
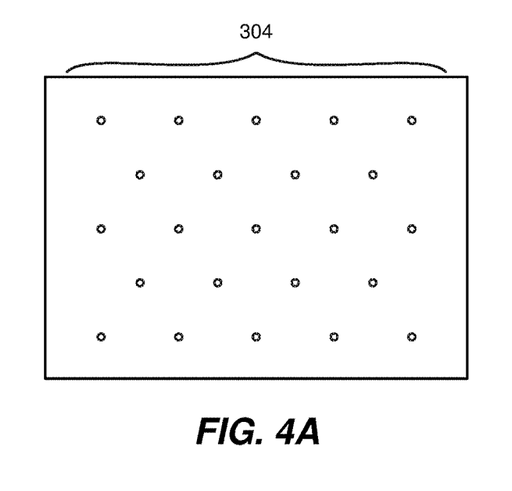
FIGS. 4A, 4B, and 4C are exemplary representations of distortions of a pattern of light points according to some embodiments.
Figure 4B:
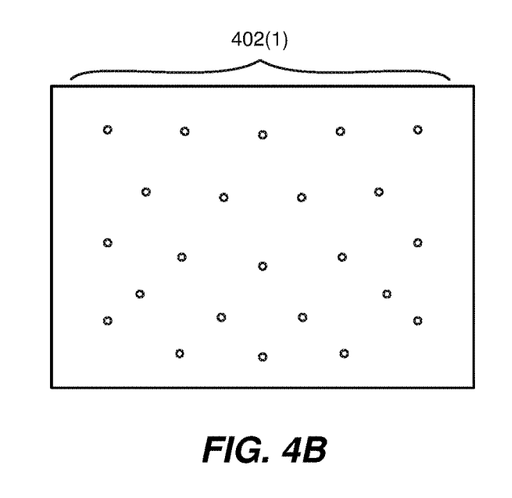
Figure 4C:
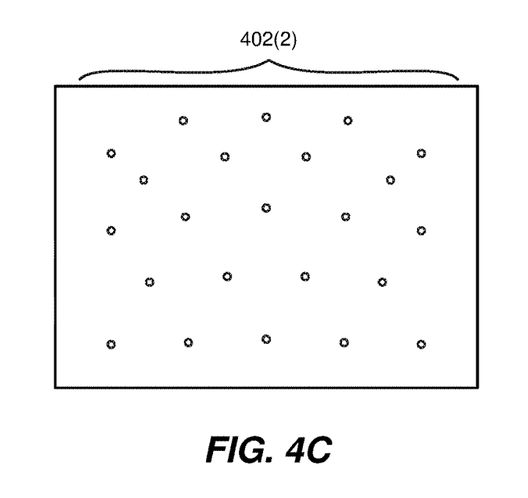

FIGS. 4A, 4B and 4C show example distortions of pattern 304 of light points. As shown in FIG. 4A, pattern 304 may be a regular grid pattern projected onto object 306 of FIG. 3. In alternative examples, pattern 304 may represent other types of symmetrical or asymmetrical patterns used to calculate distance. As shown in FIGS. 4B and 4C, cameras 104(1) and 104(2) of FIG. 3 may respectively capture distortions 402(1) and 402(2) of pattern 304, which has been reflected by object 306, to detect a distance between cameras 104(1) and 104(2) and each light point in pattern 304. In this example, distortions 402(1) and 402(2) may indicate a curvature of object 306 of FIG. 3 away from each of cameras 104(1) and 104(2) in different directions. Thus, with the combination of distortions 402(1) and 402(2) and original pattern 304, sensor apparatus 100 may determine the distance and shape of object 306 and/or other features of the local environment.

Figure 5:
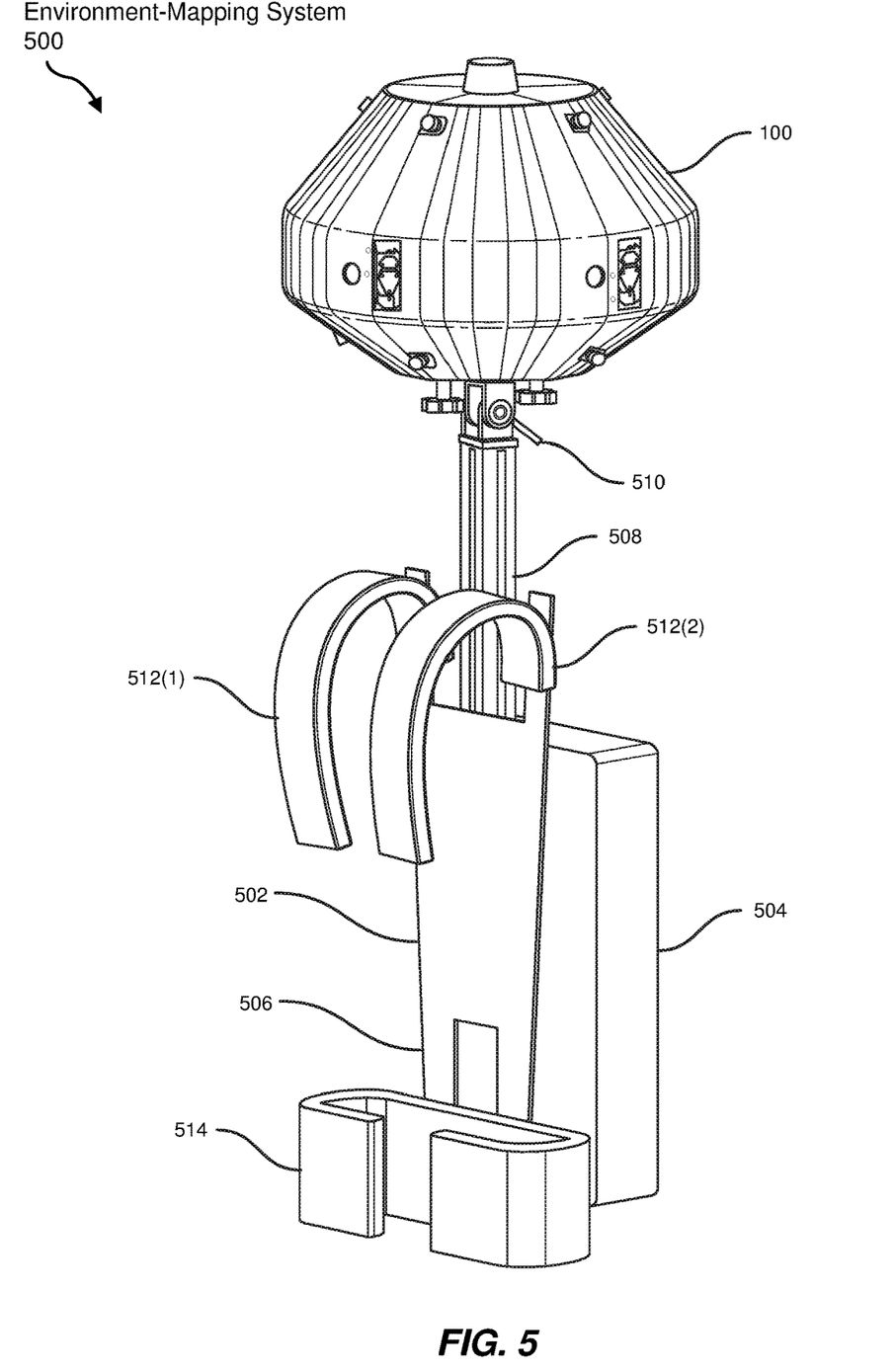
FIG. 5 is a perspective view of an exemplary environment-mapping system according to some embodiments.

FIG. 5 illustrates a perspective view of an exemplary environment-mapping system 500. In one embodiment, environment-mapping system 500 may include sensor apparatus 100, a chassis 502 that supports sensor apparatus 100 such that sensor apparatus 100 is movable within the local environment, and a computing subsystem 504 communicatively coupled to sensor apparatus 100 and mounted to chassis 502. In this embodiment and as shown in FIG. 1, sensor apparatus 100 may include a plurality of projectors that project structured light into the local environment, a plurality of cameras that capture reflections of the structured light from the local environment, a plurality of other cameras that capture visible-spectrum light from the local environment, and one or more localization devices for determining a location of sensor apparatus 100. Furthermore, in this embodiment, computing subsystem 504 may transmit control signals to sensor apparatus 100 for controlling the projectors, the cameras that capture reflections of structured light, the other cameras that capture visible-spectrum light, and/or a localization device.

In additional embodiments, sensor apparatus 100 of environment-mapping system 500 may include one or more microphones to capture ambient sound from the local environment. In these embodiments, computing subsystem 504 may also transmit the control signals to sensor apparatus 100 for controlling a microphone. The control signals may direct sensor apparatus 100 to capture specific sound, image, and/or location data and/or any other suitable data from the local environment.

Computing subsystem 504 generally represents any type or form of computing device or system capable of reading computer-executable instructions. For example, computing subsystem 504 may represent one or more endpoint devices that send, receive, and store data used for 3D mapping. Additional examples of computing subsystem 504 include, without limitation, laptops, tablets, desktops, servers, cellular phones, Personal Digital Assistants (PDAs), multimedia players, embedded systems, wearable devices (e.g., smart watches, smart glasses, etc.), gaming consoles, combinations of one or more of the same, and/or any other suitable computing device.

In some examples, a localization sensor of environment-mapping system 500 may include one or more wireless sensors of computing subsystem 504 electronically coupled to sensor apparatus 100. For example, computing subsystem 504 may include wi-fi and/or Bluetooth technology that accesses a wireless network to detect a location of sensor apparatus 100.

In the embodiment of FIG. 5, chassis 502 may include a wearable frame that may adjustably elevate sensor apparatus 100 above a user's head. For example, chassis 502 may include a backpack frame 506 dimensioned to adjustably fit to the user's shoulders and waist and a mounting pole 508 coupled to backpack frame 506 that mounts sensor apparatus 100 above the user's head at an adjustable height and/or an adjustable tilt. In this example, an adjuster 510 may adjust the length of mounting pole 508 and/or the tilt of sensor apparatus 100 relative to mounting pole 508. Shoulder straps 512(1) and 512(2) may be adjusted to securely fit around the user's shoulders, and a waist strap 514 may be adjusted to securely fit around the user's waist.

In some embodiments, computing subsystem 504 may be communicatively coupled to sensor apparatus 100 by a wired connection. In these embodiments, mounting pole 508 may hold wires and/or cords connecting sensor apparatus 100 and computing subsystem 504. Additionally or alternatively, computing subsystem 504 may be communicatively coupled to sensor apparatus 100 by a wireless connection, such as the aforementioned wi-fi or Bluetooth technology.

Figure 6:
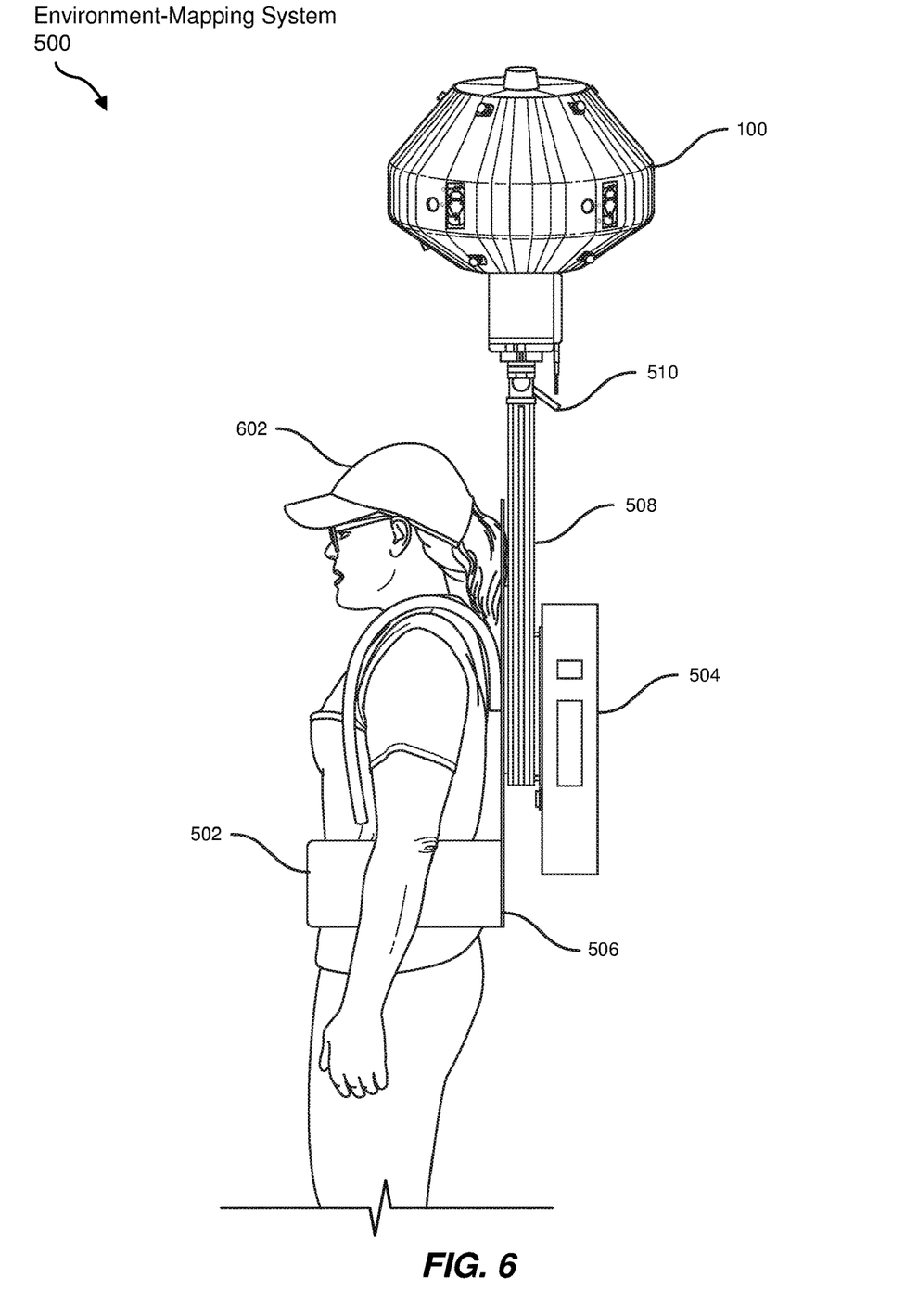
FIG. 6 is a side view of an exemplary backpack frame worn by a user according to some embodiments.

FIG. 6 illustrates a side view of backpack frame 506 worn by a user 602. As shown in FIG. 6, adjuster 510 may adjust mounting pole 508 to extend sensor apparatus 100 higher than the head of user 602 such that sensor apparatus 100 may capture the local environment with little or no obstruction from user 602. Alternatively, sensor apparatus 100 may be lowered to capture objects or features not visible from a high position. In this example, computing subsystem 504 may be portably carried by user 602 with chassis 502.

Figure 7:
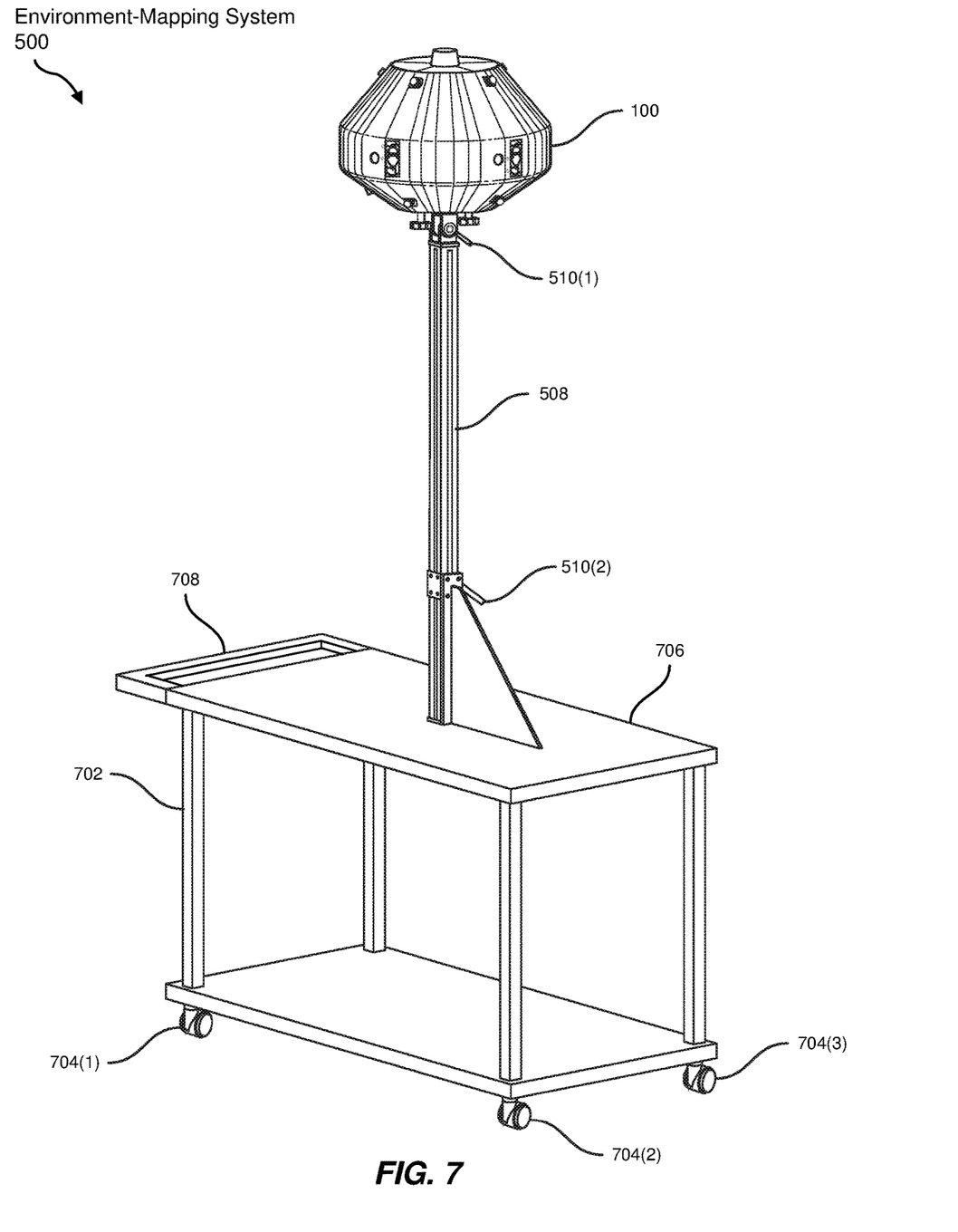
FIG. 7 is a perspective view of an exemplary rolling cart system according to some embodiments.

FIG. 7 illustrates a perspective view of an exemplary rolling cart system. In this embodiment, chassis 502 may include a mobile cart 702 dimensioned to move sensor apparatus 100 within the local environment. In some examples, mobile cart 702 may include a set of wheels, such as wheels 704(1), 704(2), and 704(3) shown in FIG. 7, a platform 706 coupled to wheels 704(1)-(3) and dimensioned to hold sensor apparatus 100 and computing subsystem 504, a handle 708 protruding from platform 706 and dimensioned to facilitate moving mobile cart 702, and mounting pole 508 coupled to platform 706 that mounts sensor apparatus 100 at an adjustable height and an adjustable tilt. In this example, computing subsystem 504 of FIG. 5 may be placed on mobile cart 702, held by the user, or otherwise carried with environment-mapping system 500.

In the example of FIG. 7, the user may push or pull mobile cart 702 by gripping handle 708. Additionally, in some examples, the user may utilize adjusters 510(1) and/or 510(2) to adjust mounting pole 508 and/or to adjust the height and/or tilt of sensor apparatus 100. While mobile cart 702 is illustrated in FIG. 7, any other suitable apparatus may be utilized to move sensor apparatus 100, computing subsystem 504, and/or other components of environment-mapping system 500 within an environment.

Figure 8:
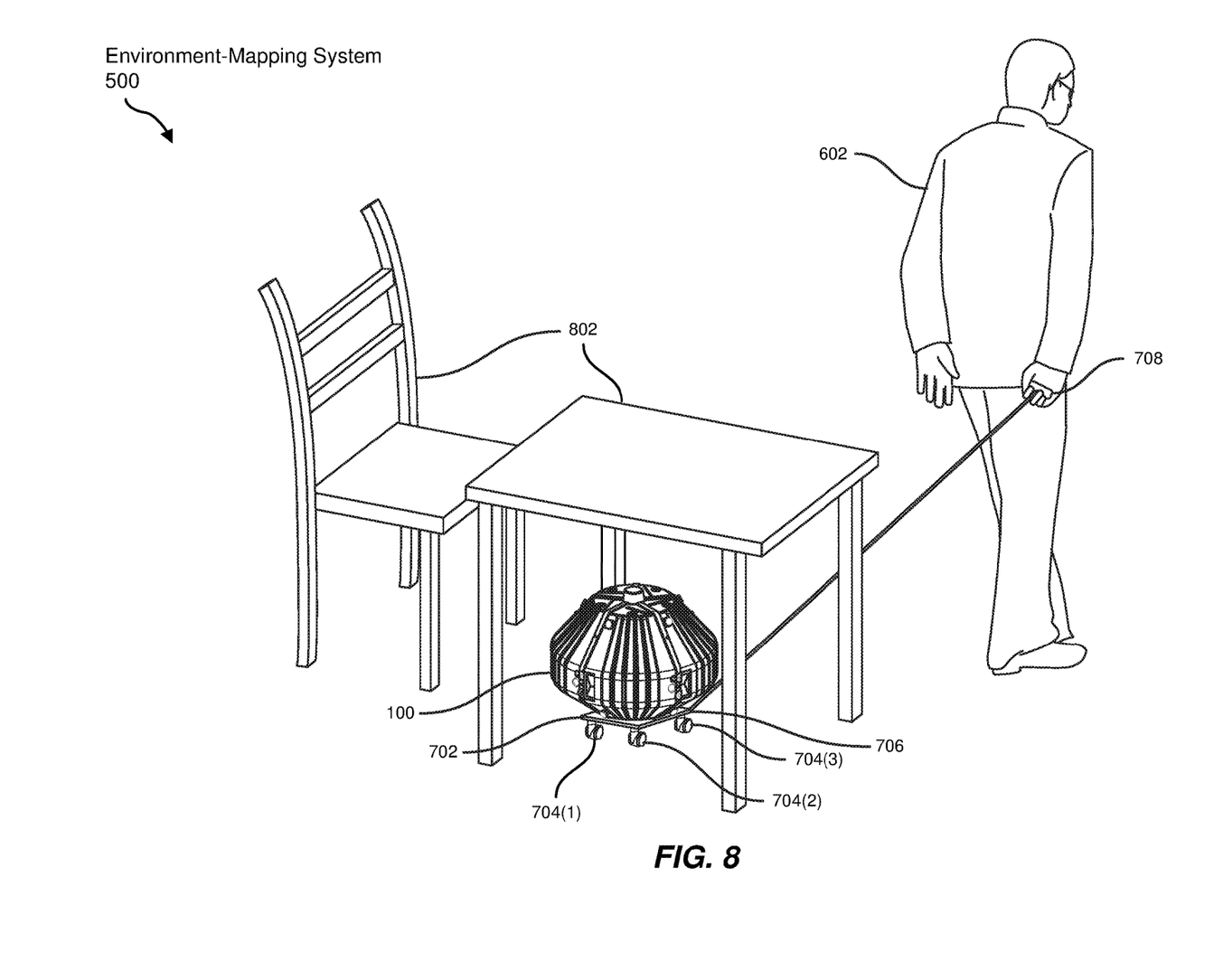
FIG. 8 is a perspective view of an example environment-mapping session according to some embodiments.

FIG. 8 illustrates a perspective view of an example environment-mapping session. As illustrated in FIG. 8, mobile cart 702 may represent a dolly or other low form of a cart dimensioned to move sensor apparatus 100 at a lower height within a local environment 802, which may include a table and a chair. In this example, the lower height may facilitate capturing structures from a different angle and/or capturing objects beneath other objects, such as user 602 pulling mobile cart 702 under the table using handle 708.

In some examples, platform 706 may be adjustable to different heights and/or orientations, rather than utilizing mounting pole 508 of FIG. 7 to adjust the height and/or tilt of sensor apparatus 100. User 602 may manipulate mobile cart 702 during the environment-mapping session to fully capture all aspects of local environment 802. Furthermore, in this example, computing subsystem 504 of FIG. 5 may be placed on mobile cart 702, carried by user 602, and/or placed elsewhere to wirelessly communicate with sensor apparatus 100.

Figure 9:
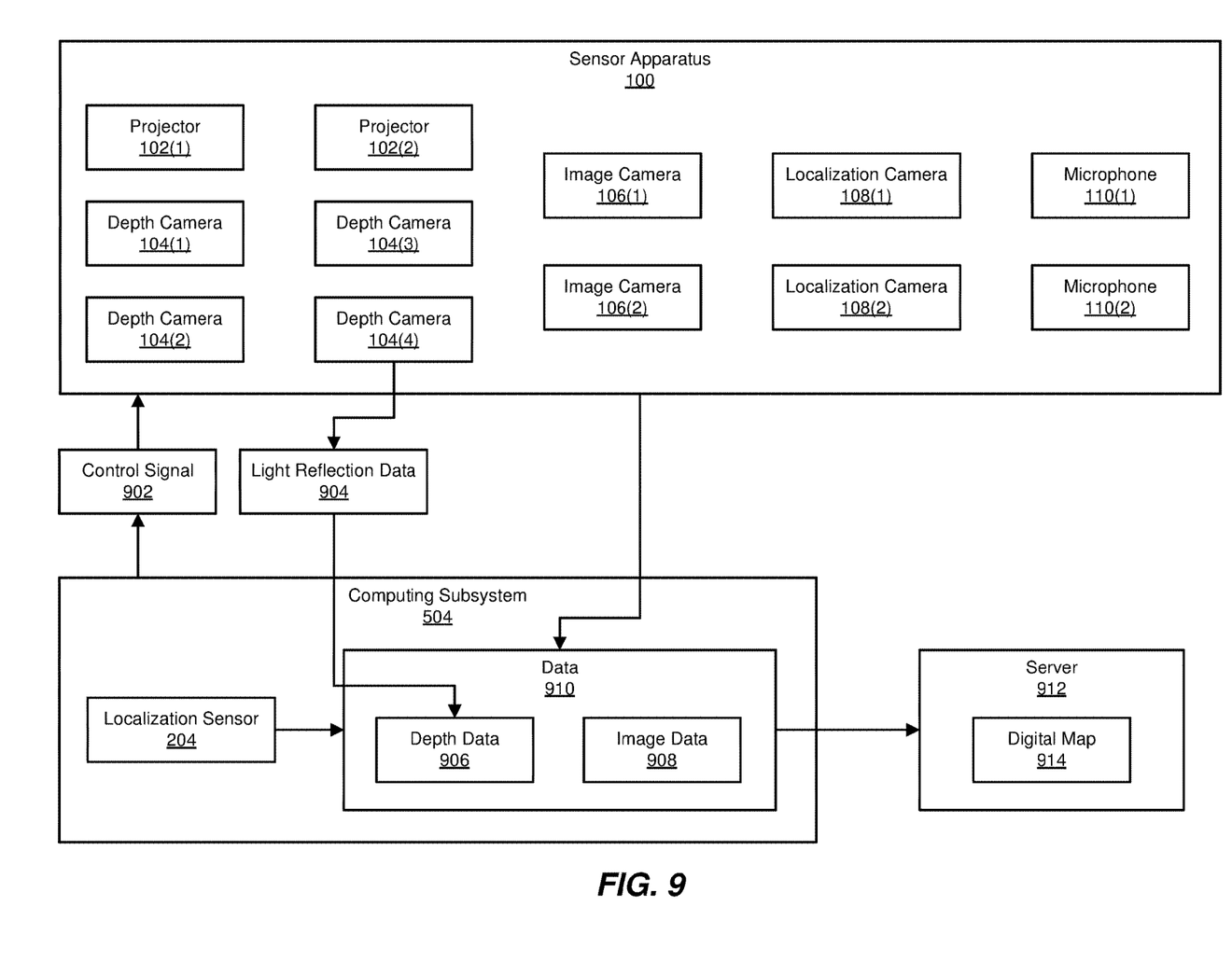
FIG. 9 is a block diagram of example electronic connections of a computing subsystem according to some embodiments.

FIG. 9 shows a block diagram of example electronic connections of computing subsystem 504. In some embodiments, computing subsystem 504 may receive depth data 906 from sensor apparatus 100 by transmitting a control signal 902 to projectors 102(1) and/or 102(2) of sensor apparatus 100 to direct projectors 102(1) and/or 102(2) to project structured light into the local environment. Sensor apparatus 100 may then collect light reflection data 904 from one or more cameras 104(1)-(4), such as camera 104(4) as shown in FIG. 9. Computing subsystem 504 may convert light reflection data 904 into depth data 906 as part of data 910 collected from sensor apparatus 100. Additionally or alternatively, control signal 902 may request image data 908 from one or more cameras 106(1) and 106(2), localization data from one or more localization cameras 108(1) and 108(2), sound data from one or more microphones 110(1) and 110(2), and/or any other data suitable for capturing from the local environment.

In one example, computing subsystem 504 may collect and store data 910 about the local environment from sensor apparatus 100 during an environment-mapping session, such as the environment-mapping session illustrated in FIG. 8. Computing subsystem 504 may further transmit data 910 from sensor apparatus 100 to an external computing device, such as server 912, that may reconstruct a digital map 914 of the local environment based on transmitted data 910. In this example, computing subsystem 504 may collect data 910 during the environment-mapping session. After the environment-mapping session has completed, computing subsystem 504 may initiate a connection to server 912 to transmit data 910 to server 912. Additionally or alternatively, computing subsystem 504 may transmit at least a portion of data 910 to server 912 during the environment-mapping session. Server 912 may then recreate digital map 914 from data 910 to represent a virtual environment based on the local environment.

Server 912 generally represents any type or form of computing device that is capable of storing and/or managing data 910. For example, server 912 may represent a computing system capable of processing data 910 and converting data 910 to digital map 914. Additional examples of server 912 include, without limitation, application servers and database servers configured to provide various database services and/or run certain software applications.

Figure 10:
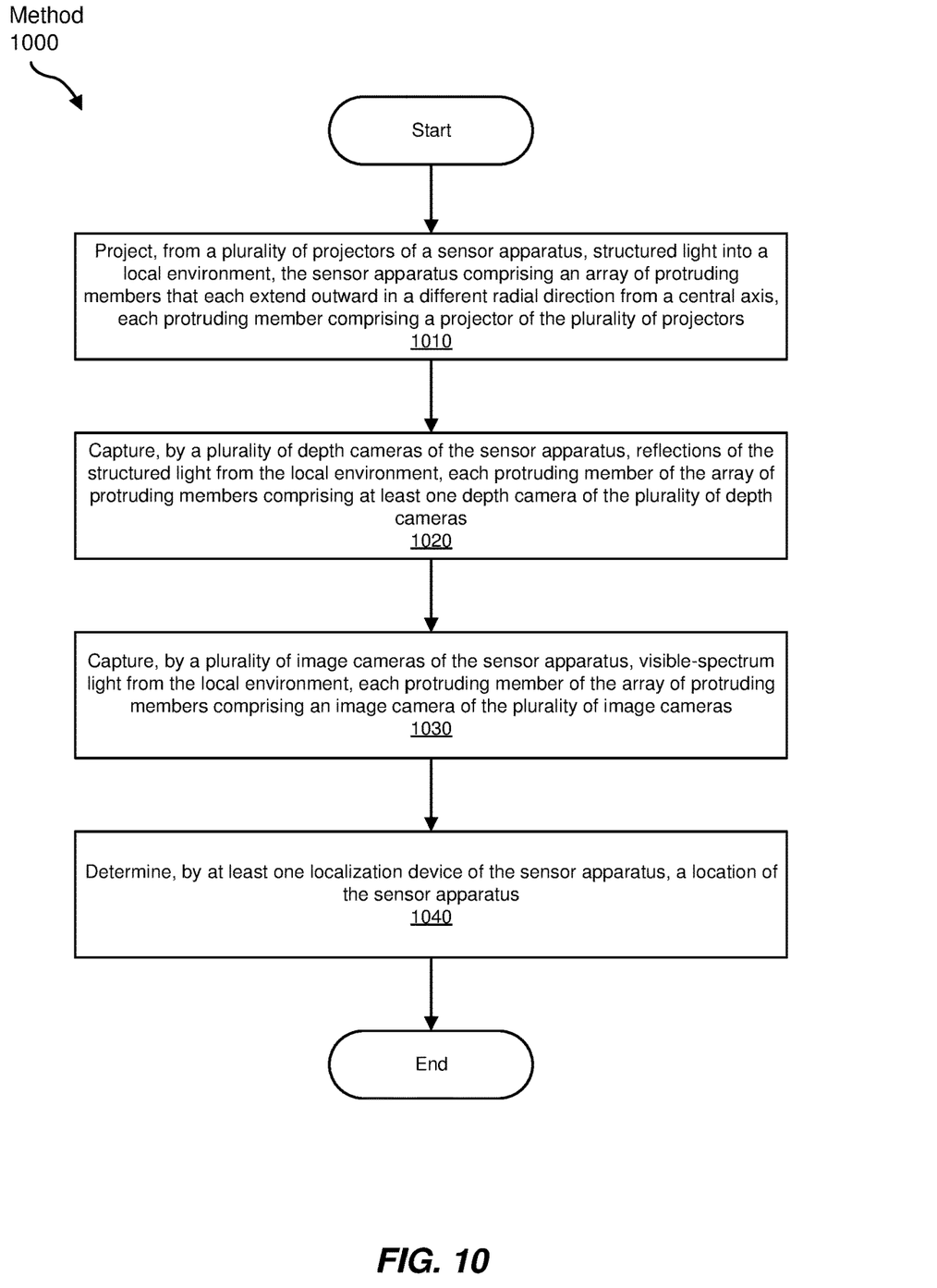
FIG. 10 is a flow diagram of an exemplary method for mapping a 3D environment according to some embodiments.

FIG. 10 shows a flow diagram of an exemplary computer-implemented method 1000 for mapping 3D environments. The steps shown in FIG. 10 may be performed by any suitable computer-executable code and/or computing system, including environment-mapping system 500 illustrated in FIGS. 5-8. In one example, each of the steps shown in FIG. 10 may represent an algorithm whose structure includes and/or is represented by multiple sub-steps, examples of which will be provided in greater detail below.

As illustrated in FIG. 10, at step 1010, one or more of the systems described herein may project, from a plurality of projectors of a sensor apparatus, structured light into a local environment, the sensor apparatus including an array of protruding members that each extend outward in a different radial direction from a central axis, each protruding member including a projector of the plurality of projectors. For example, as illustrated in FIG. 3, projector 102 may project structured light 302 into the local environment and onto one or more objects, such as object 306, and/or features located within the local environment.

The systems described herein may perform step 1010 of FIG. 10 in a variety of ways. In some embodiments, such as the example of FIG. 2, sensor apparatus 100 may include an array of protruding members 202(1)-(5) that each extend outward from a central axis. Protruding members 202(1)-(5) may each include a projector in the plurality of projectors, such as projectors 102(1)-(4). Each projector may then project structured light into the local environment. In alternate embodiments, sensor apparatus 100 may include fewer or more protruding members, resulting in fewer or more projectors. Additional projectors may provide additional detail and coverage for easily capturing data from the local environment.

Returning to FIG. 10, at step 1020, one or more of the systems described herein may capture, by a plurality of cameras of the sensor apparatus, reflections of the structured light from the local environment, each protruding member of the array of protruding members including at least one camera of the plurality of cameras that capture reflections of structured light. For example, as illustrated in FIG. 3, protruding member 202 may include two cameras 104(1) and 104(2) that capture reflections of structured light 302.

The systems described herein may perform step 1020 of FIG. 10 in a variety of ways. In some examples, as illustrated in FIG. 4, cameras 104(1) and 104(2) may capture distortions in pattern 304 projected by projector 102 of FIG. 3. Distortions 402(1) and 402(2) may be utilized in combination to determine the shape and distance of one or more objects, such as object 306 in FIG. 3, and/or features within the local environment. Additionally or alternatively, additional cameras may combine to capture multiple, overlapping patterns projected by multiple projectors to more accurately and/or quickly determine the shapes and distances of objects and other features in the local environment.

Returning to FIG. 10, at step 1030, one or more of the systems described herein may capture, by a plurality of other cameras of the sensor apparatus, visible-spectrum light from the local environment, each protruding member of the array of protruding members including a camera of the plurality of other cameras that capture visible-spectrum light. For example, as illustrated in FIG. 3, protruding member 202 may include camera 106 to capture visible-spectrum light.

The systems described herein may perform step 1030 of FIG. 10 in a variety of ways. In one embodiment, as shown in FIG. 3, camera 106 may represent a high-resolution camera capable of capturing various light colors and/or intensities in the local environment to detect one or more objects, such as object 306, and/or features. A color image captured by camera 106 may combine with depth data captured by cameras 104(1) and 104(2) to more fully and accurately capture object 306 and/or one or more other objects and/or features. Additionally, multiple cameras may combine to overlap and create a full, 360-degree representation of the local environment. Furthermore, cameras may utilize additional technologies to improve capturing objects and/or features from the local environment, such as IR-backlit AprilTags to improve detection of mirrored, transparent, and/or semi-transparent surfaces.

Returning to FIG. 10, at step 1040, one or more of the systems described herein may determine, by one or more localization devices of the sensor apparatus, a location of the sensor apparatus. For example, as illustrated in FIG. 2, sensor apparatus 100 may include localization cameras 108(1)-(4) and localization sensor 204 to determine the location of sensor apparatus 100.

The systems described herein may perform step 1040 of FIG. 10 in a variety of ways. In one example, sensor apparatus 100 of FIG. 2 may utilize localization cameras 108(1)-(4) in a SLAM system to capture the location of sensor apparatus 100 relative to other objects within the local environment. In another example, localization sensor 204 may detect GPS information and/or act as an accelerometer to determine changes in movement of sensor apparatus 100. A combination of various localization data may pinpoint the location of sensor apparatus 100 within the local environment and on a geographical scale.

In some embodiments, method 1000 of FIG. 10 may further include capturing, by one or more microphones, ambient sound from the local environment. For example, as illustrated in FIG. 1, sensor apparatus 100 may include microphones 110(1)-(4), strategically placed around sensor apparatus 100, to detect sounds from multiple directions. In some examples, a server may combine high-resolution color images, depth data, SLAM data, other localization data, and/or sound data collected by sensor apparatus 100 to create a digital map and/or other form of virtual representation of the local environment. Furthermore, by mounting sensor apparatus 100 in a movable frame, such as backpack frame 506 of FIG. 5 or mobile cart 702 of FIG. 7 or 8, the systems described herein may permit a user to maneuver sensor apparatus 100 within the local environment to fully capture objects and features in the local environment.

As discussed throughout the instant disclosure, the disclosed methods, systems, and apparatuses may provide one or more advantages over traditional 3D mapping systems. For example, a globe-like sensor apparatus described herein may fully capture a 360-degree representation of an enclosed environment without needing to wait for a camera to perform a sweep. By combining high-density projectors and a multitude of IR cameras, the methods, systems, and apparatuses described herein may detect a detailed contour of the environment using projected light patterns. Additionally, by combining high-density depth information with high-fidelity color image data and ambient sounds captured by microphones, the methods, systems, and apparatuses described herein may generate precise and detailed virtual representations of the enclosed environment that provide an immersive virtual reality experience.

Furthermore, by mounting the sensor apparatus on a frame, the disclosed methods, systems, and apparatuses may enable a user to easily move the sensor apparatus within the environment. For example, a backpack frame may enable the user to walk around the environment with the sensor apparatus to fully capture the environment from every angle. Localization cameras and sensors may further improve the precision of capturing objects and features within the environment relative to the sensor apparatus. For example, by anchoring the location of the sensor apparatus as it moves through the environment, the disclosed methods, systems, and apparatuses may capture moving objects within the environment. Thus, the methods, systems, and apparatuses described herein may improve the speed, accuracy, and ease of capturing an environment for 3D digital replication.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

As detailed above, the computing devices, systems, and subsystems described and/or illustrated herein broadly represent any type or form of computing device or system capable of executing computer-readable instructions. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A sensor apparatus comprising:
   an array of protruding members that each extend outward in a different radial direction from a central axis, each protruding member comprising:
   a projector that projects structured light into a local environment, wherein the structured light comprises a pattern of light points;
   at least one camera that captures reflections of the structured light from the local environment, wherein the camera that captures reflections of the structured light captures a distortion of the pattern of light points to detect a distance between the camera and each light point; and another camera that captures visible-spectrum light from the local environment; and at least one localization device for determining a location of the sensor apparatus.

2. The sensor apparatus of claim 1, wherein the projector is mounted to a middle section of the protruding member such that the structured light is projected away from the central axis.

3. The sensor apparatus of claim 1, wherein the localization device comprises at least one of:

at least one localization camera that captures image data for determining a relative position of the sensor apparatus within the local environment; or at least one localization sensor that determines a geographic location of the sensor apparatus.

4. The sensor apparatus of claim 1, further comprising at least one microphone that captures ambient sound from the local environment.

5. An environment-mapping system comprising:

a sensor apparatus comprising:

a plurality of projectors that project structured light into a local environment;

a plurality of cameras that capture reflections of the structured light from the local environment;

a plurality of other cameras that capture visible-spectrum light from the local environment; and at least one localization device for determining a location of the sensor apparatus;

a chassis that comprises a movable frame and that supports the sensor apparatus such that the sensor apparatus is movable within the local environment; and a computing subsystem communicatively coupled to the sensor apparatus and mounted to the chassis, wherein the computing subsystem transmits control signals to the sensor apparatus for controlling at least one of the projectors, the cameras that capture reflections of the structured light, the other cameras that capture visible-spectrum light, and the localization device.

6. The environment-mapping system of claim 5, wherein the localization device comprises at least one of:

at least one localization camera that captures image data for determining a relative position of the sensor apparatus within the local environment; or at least one localization sensor that determines a geographic location of the sensor apparatus.

7. The environment-mapping system of claim 6, wherein the localization sensor comprises at least one of:

at least one sensor mounted at a central axis of the sensor apparatus; or at least one wireless sensor of the computing subsystem electronically coupled to the sensor apparatus.

8. The environment-mapping system of claim 5, wherein the sensor apparatus comprises at least one microphone that captures ambient sound from the local environment.

9. The environment-mapping system of claim 8, wherein the computing subsystem transmits control signals to the sensor apparatus for controlling the microphone.

10. The environment-mapping system of claim 5, wherein the chassis comprises at least one of:

a wearable frame that adjustably elevates the sensor apparatus above a user's head; or a mobile cart dimensioned to move the sensor apparatus within the local environment.

11. The environment-mapping system of claim 10, wherein the wearable frame comprises:

a backpack frame dimensioned to adjustably fit to the user's shoulders and waist; and a mounting pole coupled to the backpack frame that mounts the sensor apparatus above the user's head at an adjustable height and an adjustable tilt.

12. The environment-mapping system of claim 10, wherein the mobile cart comprises at least one of:

a set of wheels;

a platform coupled to the set of wheels and dimensioned to hold the sensor apparatus and the computing subsystem;

a handle protruding from the platform and dimensioned to facilitate moving the mobile cart; or a mounting pole coupled to the platform that mounts the sensor apparatus at an adjustable height and an adjustable tilt.

13. The environment-mapping system of claim 5, wherein the computing subsystem is communicatively coupled to the sensor apparatus by at least one of:

a wired connection; or a wireless connection.

14. The environment-mapping system of claim 5, wherein the computing subsystem receives depth data from the sensor apparatus by:

transmitting a control signal to at least one projector of the plurality of projectors directing the at least one projector to project structured light into the local environment; and collecting light reflection data from at least one camera of the plurality of cameras that capture reflections of the structured light.

15. The environment-mapping system of claim 5, wherein the computing subsystem collects and stores data about the local environment from the sensor apparatus during an environment-mapping session.

16. The environment-mapping system of claim 15, wherein the computing subsystem transmits the data about the local environment from the sensor apparatus to a server that reconstructs a digital map of the local environment based on the transmitted data.

17. A method comprising:

projecting, from a plurality of projectors of a sensor apparatus, structured light into a local environment, the sensor apparatus comprising an array of protruding members that each extend outward in a different radial direction from a central axis, each protruding member comprising a projector of the plurality of projectors, wherein the structured light comprises a pattern of light points;

capturing, by a plurality of cameras of the sensor apparatus, reflections of the structured light from the local environment, each protruding member of the array of protruding members comprising at least one camera of the plurality of cameras that capture reflections of the structured light, wherein the plurality of cameras that capture reflections of the structured light capture distortions of the pattern of light points to detect a distance between the plurality of cameras and each light point;

capturing, by a plurality of other cameras of the sensor apparatus, visible-spectrum light from the local environment, each protruding member of the array of protruding members comprising a camera of the plurality of other cameras that capture visible-spectrum light; and determining, by at least one localization device of the sensor apparatus, a location of the sensor apparatus.

18. The method of claim 17, further comprising capturing, by at least one microphone, ambient sound from the local environment.

19. The method of claim 17, wherein the localization device comprises at least one of:
   at least one localization camera that captures image data for determining a relative position of the sensor apparatus within the local environment; or
   at least one localization sensor that determines a geographic location of the sensor apparatus.

20. The method of claim 17, wherein the sensor apparatus is coupled to a chassis that comprises a movable frame and that supports the sensor apparatus such that the sensor apparatus is movable within the local environment.

* * * * *